(12) United States Patent
Preda et al.

(10) Patent No.: US 8,716,851 B2
(45) Date of Patent: May 6, 2014

(54) CONTINUOUSLY REFERENCING SIGNALS OVER MULTIPLE LAYERS IN LAMINATE PACKAGES

(75) Inventors: Francesco Preda, New Braunfels, TX (US); Lloyd A. Walls, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 58 days.

(21) Appl. No.: 13/417,879

(22) Filed: Mar. 12, 2012

(65) Prior Publication Data

US 2012/0174047 A1 Jul. 5, 2012

Related U.S. Application Data

(60) Continuation of application No. 12/490,872, filed on Jun. 24, 2009, now Pat. No. 8,158,461, which is a division of application No. 11/551,888, filed on Oct. 23, 2006, now abandoned.

(51) Int. Cl.
*H01L 23/02* (2006.01)
(52) U.S. Cl.
USPC .......................................... 257/678; 716/106
(58) Field of Classification Search
USPC ......... 438/125, 106, 652, 626, 627, 631, 118, 438/108, 109, 110, 111, 112, 113; 257/778–784, 750, 758; 716/106
See application file for complete search history.

(56) References Cited

U.S. PATENT DOCUMENTS 6,762,367 B2 7/2004 Audet et al.
7,397,132 B2 7/2008 Suzuya

OTHER PUBLICATIONS

U.S. Appl. No. 11/551,888.
U.S. Appl. No. 12/490,872.

*Primary Examiner* — Hoa B Trinh
(74) *Attorney, Agent, or Firm* — Stephen R. Tkacs; Stephen J. Walder, Jr.; Diana R. Gerhardt

(57) ABSTRACT

A mechanism for continuously referencing signals over multiple layers in laminate packages provides a continuous path for signals from one layer to another while using the ideal voltage reference for all areas of the package and still avoiding discontinuities in the voltage reference. A reference plane adjustment engine analyzes a package design and identifies an ideal top plane for all areas of the package, including areas under particular chip die(s) and areas that are not under a chip die. The reference plane adjustment engine then modifies the package design to reposition ground planes, source voltage planes, signal planes, and vias between layers to maintain a continuous voltage reference regardless of the top layer. The reference plane adjustment engine provides the resulting mixed voltage plane package design to a design analysis engine. A package fabrication system fabricates the package.

20 Claims, 4 Drawing Sheets

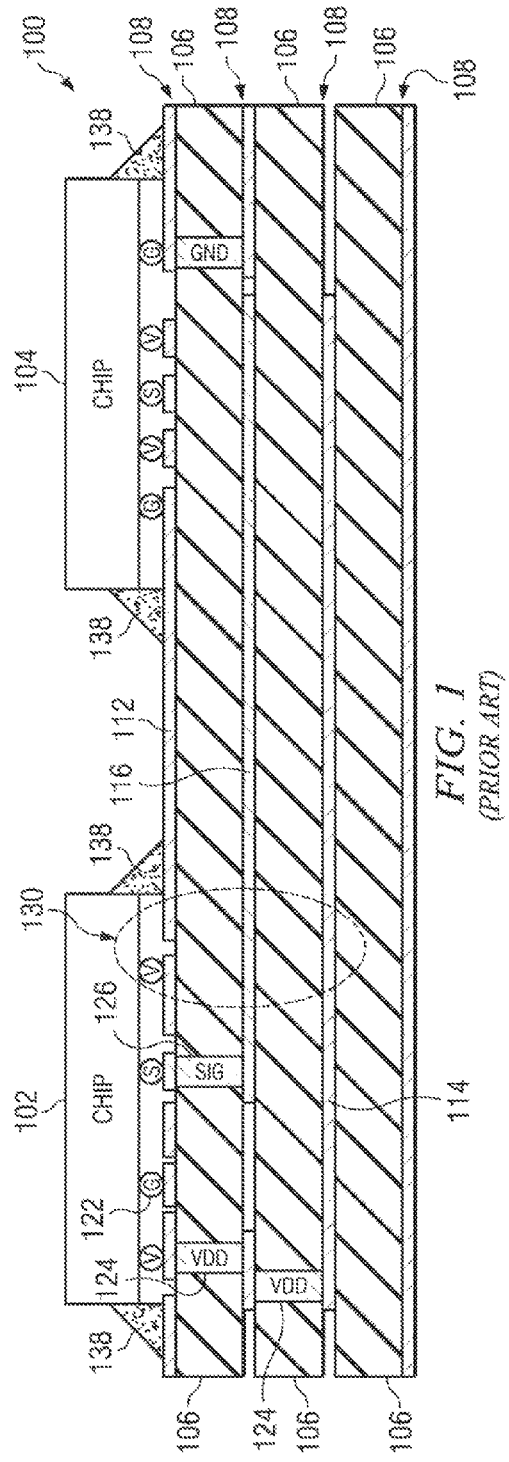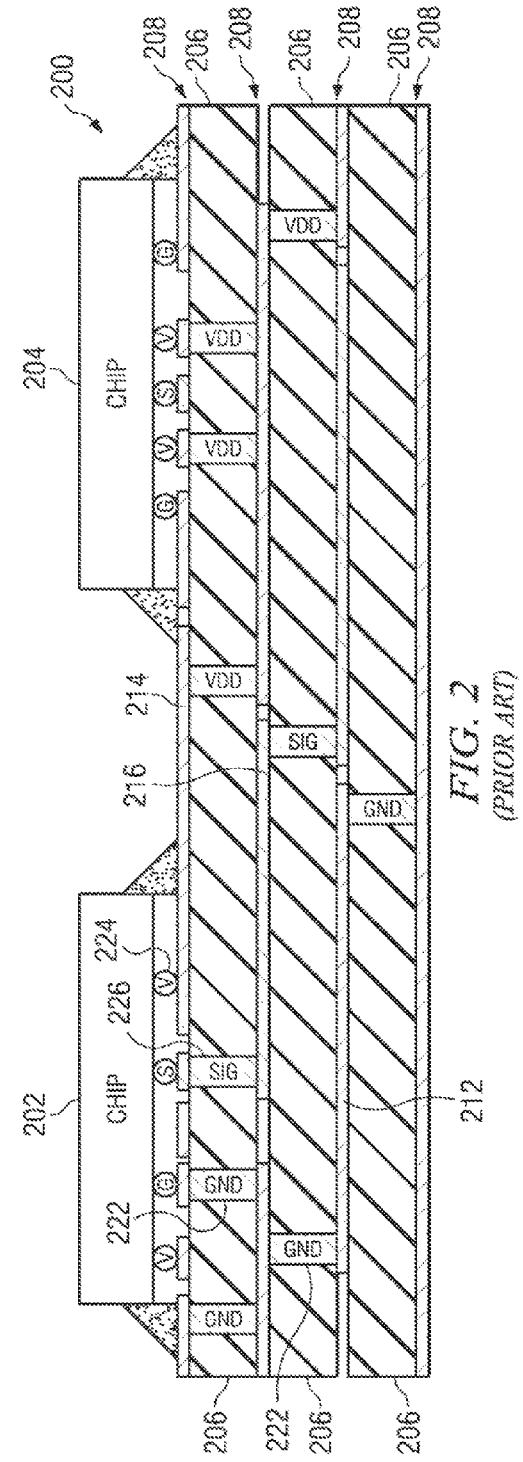

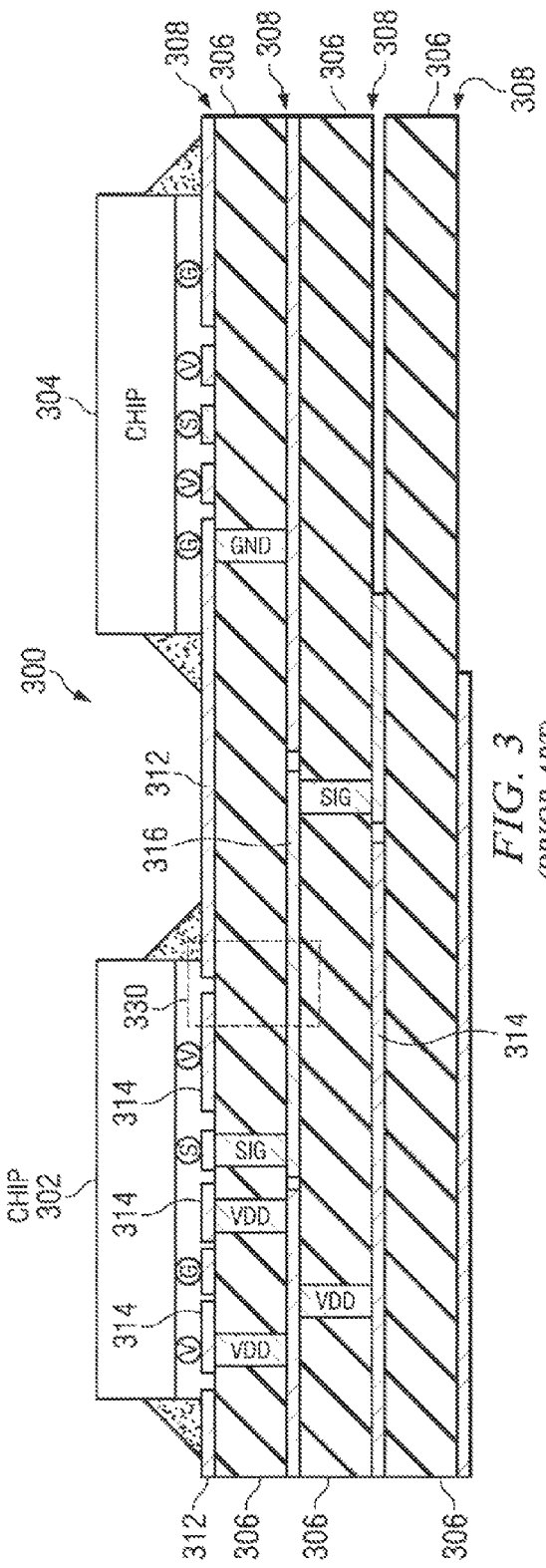
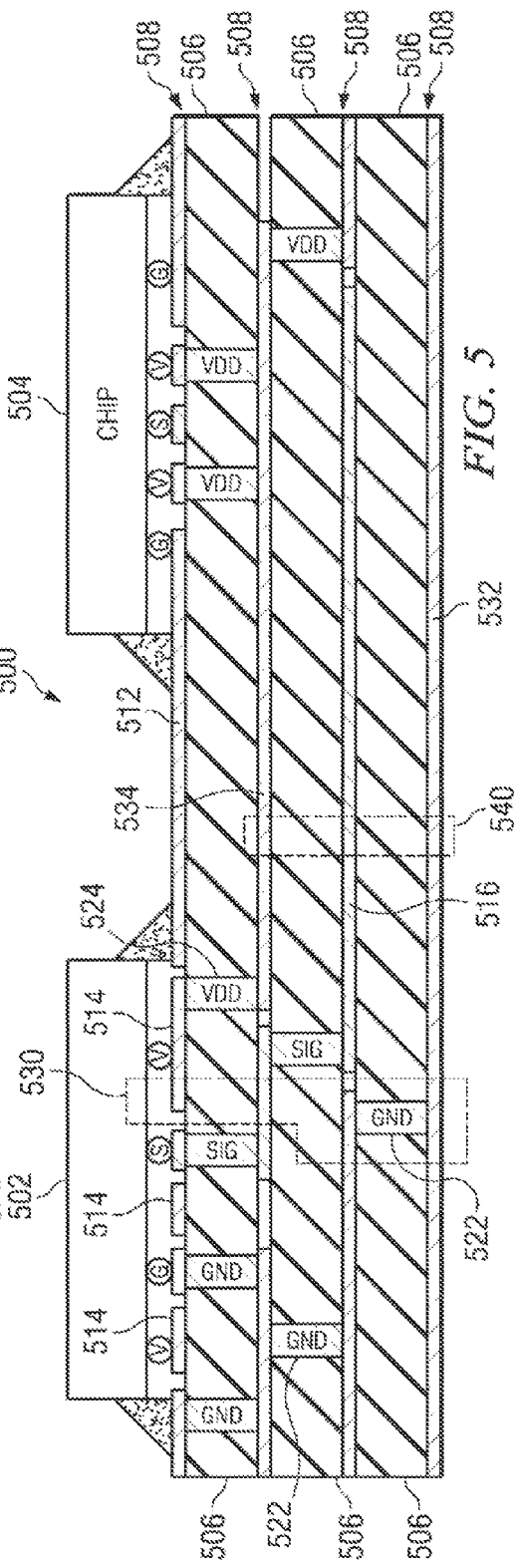
*FIG. 3 (PRIOR ART)*
*FIG. 5*

CONTINUOUSLY REFERENCING SIGNALS OVER MULTIPLE LAYERS IN LAMINATE PACKAGES

This application is a continuation of application Ser. No. 12/490,872, filed Jun. 24, 2009, status allowed.

BACKGROUND

1. Technical Field

The present application relates generally to an improved package design configuration. More specifically, the present application is directed to a method and apparatus for continuously referencing signals over multiple layers in laminate packages.

2. Description of Related Art

A die is an unpackaged piece of silicon containing the functional components of a device. "Die," also referred to as a "chip" herein, is the formal term for the piece of silicon containing an integrated circuit. A package is a housing that chips come in for plugging into or soldering onto printed circuit boards. The package provides electrical wiring and connections to pins. A lid covers the chip and bonds with the package.

The exemplary aspects of the present invention concern an improved package design configuration with continuous voltage reference for signals transmitted through layers of a laminate package. A discussion of laminate packages follows to provide a context for the exemplary aspects of the present invention; however, the illustrative embodiments described herein should not be limited to any particular package type.

The chip is bonded to the package using, for example, solder, controlled collapse chip connection (C4), or wire bond. Other package configurations are known in the art, such as flip-chip, for example. Creating a mounting for a chip might seem trivial to the uninitiated, but the ability to provide more and more input/output (I/O) interconnections to chips that are shrinking in size and growing in complexity is an ever-present problem.

A common chip package is the dual in-line package (DIP). A DIP is a rectangular chip housing with leads (pins) on both long sides. Tiny wires bond the chip to metal leads that wind their way into spider-like feet that are inserted into a socket or soldered onto a circuit board. A ceramic dual in-line package (CDIP) is a type of ceramic DIP made of ceramic materials. A CDIP package is made of ceramic materials and often uses gold-plated leads attached to two sides by brazing and a metal lid bonded to the package with a metal seal. A CERDIP uses a ceramic lid that is bonded to the package with a glass seal. A plastic leaded chip carrier (PLCC) package is a plastic, often square, surface-mount chip package that contains leads on all four sides. The leads (pins) extend down and back under and into tiny indentations in the housing. A ceramic quad (CERQUAD) package is a substantially square, ceramic, surface-mount chip package. A CERQUAD package uses a ceramic lid that is bonded to the package with a glass seal. A CERQUAD package has pins on all four sides that wrap under like those of a PLCC package.

Flip chip plastic ball grid arrays (FlxI/OTM or FCPBGA) utilize multi-layer organic substrate solutions. The advent of FCPBGA allows a circuit designer to place signal I/O anywhere on the chip. This approach is also known as Area Array I/O or Core I/O. Solder bumps on the active surface of the chip are used to connect to the substrate. The chip is flipped, facedown, and the bumps are soldered to the surface of the package. An array of solder balls on the package fastens to the host circuit board while providing a low inductance electrical path to the board. "FlxI/OTM" is a trademark of LSI Logic Corporation in the United States, other countries, or both.

Land grid array (LGA) is a package that contains terminations on the bottom of the package. The exposed package must be mounted onto a printed circuit board, and proper connections must be made in order for the device to function correctly. One of the main reasons for using land grid array packages and other surface mount connectors is to increase the number of pins that connect within an area of a printed circuit board. With more pins in a small amount of space, one can increase the number of electrical connections between the chip and the printed circuit board. In addition, LGA provides for a shorter distance from the pin to the connection point on the board. This helps to ensure the clarity and quality of the signal by reducing lead inductance and capacitance. With ball grid array (BGA) technology, balls of solder are used to make the package area distributed connections from the chips to the board. BGA provides increased levels of electrical performance. In addition, these products are known to withstand heat better than pins and socket adapters. Other package types are known to those skilled in the art.

A package consists of a plurality of conductive layers separated by insulator layers. The conductive layers may carry a source voltage reference, a ground voltage, or signals provided by chips. It is desirable to situate signal planes in the package between a source voltage (VDD) plane and a ground (GND) plane in the package to provide a voltage reference and shield for signals that come from the chip and travel through the package. Every signal path is part of a closed circuit. If the signal is high, then it is brought up to the source voltage and current must travel to ground. If the signal is low, then it is brought down to ground and current must travel from the source to the ground potential. In either case, the signal must have a return path.

When a signal is transmitted on a signal plane, it is ideal to have a return path, a voltage reference, nearby. Without a voltage reference nearby, the signal will seek out some other return path. That other return path may have different impedance, which will distort the signal, because the difference in impedance changes the amount of signal that gets reflected at the end.

An entire signal path, which must form a closed circuit, can be viewed as a transmission line, such as a pair of conductors. As a signal propagates down the pair of conductors, each new section acts electrically as a small lumped circuit element. In its simplest form, called the lossless model, the equivalent circuit of a transmission line has just inductance and capacitance. These elements are distributed uniformly down the length of the transmission line.

Without a voltage reference nearby, a signal path, which must form a closed circuit, resembles a lossy transmission line model where the sections of the circuit are not uniform. Some sections of the closed circuit may have added impedance. With a lossy transmission line model, there may be reflections from characteristic impedance changes, which degrade the signal being transmitted.

Due to differences in chip design, one chip may be better suited for having the ground plane on top and another chip may be better suited for having the voltage source plane on top. In addition, even though having the source voltage plane on top may provide ideal voltage referencing in an area under a particular chip, having the source voltage plane on top may cause reliability issues in areas away from the chip.

As a particular example, providing vias to lower layers in the package requires breaks in the top layer. For instance, the package design may call for the ground plane to be on top; however, a particular chip may require a high concentration of vias to lower layers, to the source voltage plane or signal planes, in a particular area of a package design. This would result in a break in the voltage reference. That is, due to the chip design and the chosen top layer, the signal layer may pass under holes in the top layer, and in these areas the signal path may not have ideal transmission line characteristics.

A mixed plane design uses one voltage plane on top for certain areas of the package and another voltage plane on top for other areas. For example, one may determine that having the source voltage plane on top is ideal under a particular chip to avoid excess holes in the top layer due to the number of vias necessary to connect to lower layers, while having the ground plane on top is ideal for areas that are not under the chip. In fact, one may determine that one voltage plane is preferred under one chip while another voltage plane is preferred under a second chip on the same package.

The signal plane may have a voltage reference by virtue of being positioned below the source voltage plane and above the ground plane under the area of the chip, for example. In an area that is not under the chip, the signal plane may have a voltage reference by virtue of being positioned below the ground plane and above the source voltage plane in another area of the package. This design may attempt to provide an ideal voltage reference for all areas of the package; however, the signal plane may cross a void where the voltage reference switches or breaks, which causes distortion and degrades the quality of the signal at the receiving end.

SUMMARY

In accordance with exemplary aspects of the illustrative embodiments, a path for signals is provided from one layer to another while using an ideal voltage reference for all areas of the package and still avoiding discontinuities in the voltage reference. A reference plane adjustment engine analyzes a package design and identifies an ideal top plane for all areas of the package, including areas under particular chip(s) and areas that are not under a chip. The reference plane adjustment engine then modifies the package design to position signal planes and voltage planes, and vias between layers, to maintain a continuous voltage reference regardless of the top layer, and without adding a layer to the package. The reference plane adjustment engine provides the resulting mixed voltage plane package design to a design analysis engine. A package fabrication system fabricates the package.

In one illustrative embodiment, a laminate chip package comprises a plurality of insulator layers and a plurality of patterned conductive layers comprising a first layer, a fourth layer, and two intermediate layers between successive insulator layers. Selective portions are connected between layers using vias that extend through the successive insulator layers. A first area of the first layer under a first chip is connected to a source voltage. A second area of the first layer under a second chip is connected to a ground potential. A conductive signal plane positioned in a conductive layer within the plurality of conductive layers, and extending from beneath the first chip to beneath the second chip. The signal plane maintains a relatively consistent impedance from beneath the first chip to beneath the second chip by a balanced proximity of a second conductive layer connected to the source voltage and the fourth conductive layer connected to the ground potential, without adding layers to the laminate chip package.

In one exemplary embodiment, a source voltage plane is connected from the first layer in the first area to one of the two intermediate layers in the second area using one or more vias. In a further exemplary embodiment, the conductive signal plane is connected from a second layer within two intermediate layers in the first area to a third layer within the two intermediate layers in the second area using one or more vias. In a still further exemplary embodiment, a ground plane is connected from the third layer in the first area to the fourth layer in the second area using one or more vias such that the signal plane maintains a balanced proximity to the source voltage plane and the ground plane.

In another exemplary embodiment, a third area of the top layer under a second chip is connected to a source voltage. The conductive signal plane is positioned within the plurality of conductive layers such that a path of the conductive signal plane maintains a relatively consistent impedance from beneath the second area to beneath the third area by a balanced proximity of a conductive layer connected to the source voltage and a conductive layer connected to the ground potential.

In another illustrative embodiment, a method of fabricating a laminate chip package comprises receiving a laminate package design for a laminate chip package having a plurality of insulator layers and a plurality of patterned conductive layers comprising a first conductive layer, a fourth conductive layer, and two intermediate conductive layers, identifying a first preferred voltage plane for the first conductive layer within a first area of the laminate package design, and identifying a second preferred voltage plane for the first conductive layer within a second area of the laminate package design. The first preferred voltage plane is one of a source voltage plane or a ground plane and the second preferred voltage plane is the other of the source voltage plane and the ground plane. The method further comprises positioning signal planes, source voltage planes, and ground planes within the plurality of conductive layers such that a path of the signal plane maintains a relatively consistent impedance from beneath the first area to beneath the second area by a balanced proximity to a conductive layer connected to the source voltage and a conductive layer connected to ground potential, without adding layers to the laminate package design, to form a mixed voltage plane package design. The method further comprises fabricating the laminate chip package based on the mixed voltage plane package design.

In one exemplary embodiment, the first area is under a first chip and wherein the first voltage plane is a source voltage plane. In a further exemplary embodiment, the second area is not under a chip and wherein the second preferred voltage plane is the ground plane.

In a still further embodiment, the method further comprises identifying a third preferred voltage plane for the first conductive layer within a third area of the laminate package design under a second chip. The third preferred voltage plane is the source voltage plane. The positioning step includes positioning the signal planes, the source voltage planes, and the ground planes within the plurality of conductive layers such that a path of the signal plane maintains a relatively consistent impedance from beneath the second area to beneath the third area by a balanced proximity of a conductive layer connected to the source voltage and a conductive layer connected to ground potential, without adding layers to the laminate package design.

In another exemplary embodiment, the positioning step comprises connecting a source voltage plane from the first layer in the first area to a second layer within the two intermediate layers in the second area using one or more vias. In a further exemplary embodiment, the positioning step comprises connecting the signal plane from a second layer within the two intermediate layers in the first area to a third layer within the two intermediate layers in the second area using one or more vias. In a still further exemplary embodiment, the positioning step comprises connecting a ground plane from the third layer within the two intermediate layers in the first area to the fourth layer in the second area using one or more vias such that the signal plane maintains a balanced proximity to the source voltage plane and the ground plane.

In yet another illustrative embodiment, a system for fabricating a laminate chip package comprises a package design system that provides a laminate package design for a laminate chip package having a plurality of insulator layers and a plurality of patterned conductive layers comprising a first conductive layer, a fourth conductive layer, and two intermediate conductive layers. The system further comprises a design analysis engine that identifies a first preferred voltage plane for the first conductive layer within a first area of the laminate package design and a second preferred voltage plane for the first conductive layer within a second area of the laminate package design. The first preferred voltage plane is one of a source voltage plane or a ground plane and the second preferred voltage plane is the other of the source voltage plane and the ground plane. The system further comprises a reference plane adjustment engine that positions signal planes, source voltage planes, and ground planes within the plurality of conductive layers such that a path of the signal plane maintains a relatively consistent impedance from beneath the first area to beneath the second area by a balanced proximity to a conductive layer connected to the source voltage and a conductive layer connected to ground potential, without adding layers to the laminate package design, to form a mixed voltage plane package design. The system further comprises a package fabrication system that fabricates the laminate chip package based on the mixed voltage plane package design.

In one exemplary embodiment, the first area is under a first chip and wherein the first voltage plane is a source voltage plane. In a further exemplary embodiment, the second area is not under a chip and wherein the second preferred voltage plane is the ground plane.

In a still further exemplary embodiment, the design analysis engine identifies a third preferred voltage plane for the first conductive layer within a third area of the laminate package design under a second chip. The third preferred voltage plane is the source voltage plane. The reference plane adjustment engine positions the signal planes, the source voltage planes, and the ground planes within the plurality of conductive layers such that a path of the signal plane maintains a relatively consistent impedance from beneath the second area to beneath the third area by a balanced proximity to a conductive layer connected to the source voltage and a conductive layer connected to the ground potential, without adding layers to the laminate package design.

In another exemplary embodiment, the reference plane adjustment engine connects a source voltage plane from the first layer in the first area to a second layer within the two intermediate conductive layers in the second area using one or more vias. In a further exemplary embodiment, the reference plane adjustment engine connects the signal plane from the second layer in the first area to a third layer within the two intermediate conductive layers in the second area using one or more vias.

In a further exemplary embodiment, the reference plane adjustment engine connects a ground plane from the third layer in the first area to the fourth layer in the second area using one or more vias such that the signal plane maintains a balanced proximity to the source voltage plane and the ground plane.

These and other features and advantages of the present invention will be described in, or will become apparent to those of ordinary skill in the art in view of, the following detailed description of the exemplary embodiments of the present invention.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

FIG. 1 illustrates an example chip package with a ground voltage plane on top;

FIG. 2 illustrates an example chip package with a source voltage plane on top;

FIG. 3 illustrates an example chip package with a mixed top plane;

FIG. 5 illustrates an example cross-section of a chip package with a mixed top plane in accordance with an illustrative embodiment;

DETAILED DESCRIPTION OF THE PREFERRED EMBODIMENTS

Figure 4:
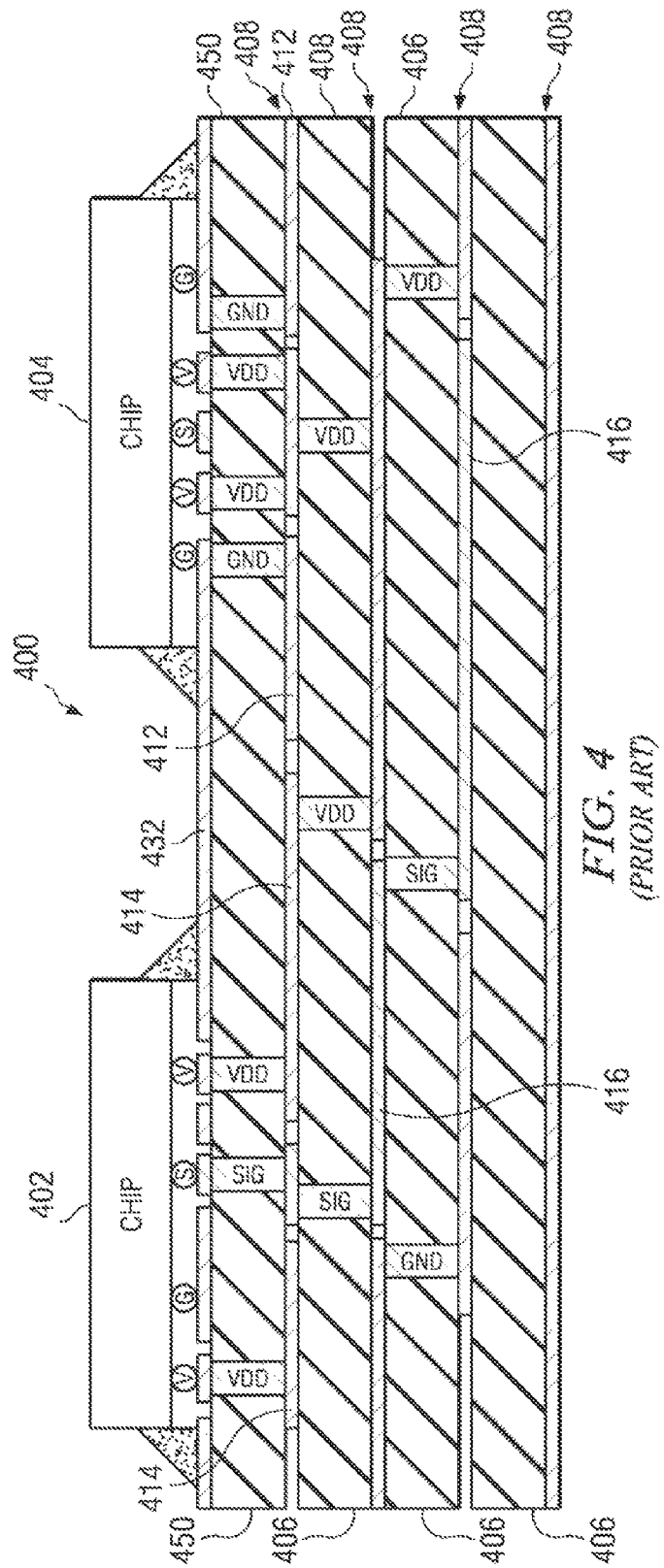
FIG. 4 illustrates an example chip package with ground voltage plane on top meeting reliability requirements by adding a layer.

The illustrative embodiments provide an improved mechanism for continuously referencing signals over multiple layers in laminate packages. In order to illustrate the primary configuration differences between the improved package design configuration and known laminate packages, reference will first be made to FIGS. 1-4, which illustrate various views of known package designs.

FIG. 1 illustrates an example cross-section of a chip package with a ground voltage, or potential, plane on top. The package includes chip 102 and chip 104, which are placed on package 100. Package 100 comprises a plurality of insulator layers 106 and a plurality of patterned conductor layers 108. Package 100 may also be referred to as a "chip carrier" or "substrate." Chips 102, 104 may be sealed to the package substrate using hermetic seal 138, for example.

In the example depicted in FIG. 1, ground voltage plane 112 is the top voltage plane. Chip 102 may be connected to ground (GND) plane 112 using conductive adhesive bond 122, which may be, for example, solder, controlled collapse chip connection (C4), or wire bond. A person of ordinary skill in the art will recognize that other package configurations may also be used, such as flip chip, for example.

It is desirable to provide a voltage reference for signals that come from chip 102 and travel through the package. In the example depicted in FIG. 1, chip 102 connects to source voltage plane 114 through vias 124. Chip 102 connects to signal plane 116 through via 126. Signal plane 116 carries a signal generated by components on chip 102 to devices outside package 100 or to one or more other chips, such as chip 104, on package 100.

In this instance, signal plane 116 has a voltage reference by virtue of being positioned between ground plane 112 and source voltage plane 114. Placing signal plane 116 between voltage plane 112 and ground plane 114 provides a consistent return path for the signal, which results in a more stable signal.

Note, however, that in area 130, voltage and signal connections cause gaps in ground plane 112. A high concentration of vias to lower layers in a particular area of a package design may result in a break in the voltage reference. That is, due to the package design, the signal layer 116 may pass under holes in the ground plane 112; therefore, the voltage reference may not be continuous, meaning the transmission line model may not be represented as a series of uniform circuits having equal inductance, capacitance, and impedance. This substandard referencing may result in adverse transmission line effects.

In the depicted example, under chip 102, signal plane 116 does not provide a consistent reference voltage in area 130. Given the layout of chip 102, one may determine that the source voltage plane is a preferable top layer for the area under chip 102.

FIG. 2 illustrates an example cross-section of a chip package with the source voltage plane on top. The package includes chip 202 and chip 204, which are placed on package 200. Package 200 comprises a plurality of insulator layers 206 and a plurality of patterned conductor layers 208. In the example depicted in FIG. 2, source voltage (VDD) plane 214 is the top voltage plane. Chip 202 may be connected to source voltage plane 214 using conductive adhesive bond 224, which may be, for example, solder, controlled collapse chip connection (C4), or wire bond.

In the example depicted in FIG. 2, chip 202 connects to ground (GND) plane 212 through vias 222. Chip 202 connects to signal plane 216 through via 226. Signal plane 216 carries a signal generated by components on chip 202 to devices outside package 200 or to one or more other chips, such as chip 204, on package 200.

In this instance, signal plane 216 has a voltage reference by virtue of being positioned between source voltage plane 214 and ground plane 212, which results in a more stable signal. As stated above, one area of the package may be better suited for having the ground plane on top and another area of the package may be better suited for having the voltage source plane on top. Therefore, while the ground plane may be the preferred top plane when considering the package as a whole, as in FIG. 1, the ground plane may not be ideal for the area under a particular chip. On the other hand, having the source voltage plane on top for the entire package, as in FIG. 2, may cause reliability issues in areas away from the chip.

FIG. 3 illustrates an example cross-section of a chip package with a mixed top plane. The package includes chip 302 and chip 304, which are placed on package 300. Package 300 comprises a plurality of insulator layers 306 and a plurality of conductor layers 308. In the example depicted in FIG. 3, source voltage (VDD) plane 314 is the top voltage plane under chip 302, and ground plane 312 is the top plane under chip 304 and in an area that is not under chip 302 or chip 304, e.g. the area between chips 302 and 304. This is referred to herein as a "mixed plane."

In the example depicted in FIG. 3, signal plane 316 has a voltage reference by virtue of being positioned below source voltage plane 314 and above ground plane 312 in an area that is not under the area of chip 302. However, in area 330, under chip 302, the signal plane does not have a consistent reference voltage, because the top plane switches from source voltage plane 314 to ground plane 312. This design is referred to as "mixed referencing," because the same signal path crosses two different reference planes.

Mixed referencing may attempt to provide an ideal voltage reference for all areas of package 300; however, signal plane 316 must cross a void at 330 where there is a break in the voltage reference, which causes distortion and degrades the quality of the signal at the receiving end. The mixed referencing in FIG. 3 lacks ideal transmission line characteristics, because the transmission line model is not uniform. The transition and reversal of the voltage reference results in an impedance change, which causes reflections that degrade the signal.

FIG. 4 illustrates an example cross-section of a chip package with ground voltage plane on top meeting reliability requirements by adding a layer. The package includes chip 402 and chip 404, which are placed on package 400. Package 400 comprises a plurality of insulator layers 406 and a plurality of conductor layers 408. In the example depicted in FIG. 4, ground plane 432 is the top plane across package 400. That is, an extra layer, layer 450, is added to allow a uniform top plane across the package, in this case ground plane 432.

The remaining layers are shifted down a layer with respect to the example shown in FIG. 2. Source voltage (VDD) plane 414 is the "top" voltage plane under chip 402, and ground plane 412 is the "top" plane under chip 404, where the "top" plane is actually the plane under the added layer 432. The "top" plane in an area that is not under chip 402 or chip 404 can now be either the source voltage plane or the ground plane, because ground layer 432 prevents any reliability issues in the area not under a chip. At the same time, signal plane 416 maintains a consistent voltage reference. However, this design requires an extra layer, which adds cost and complexity to the package design and fabrication.

In accordance with exemplary aspects of the illustrative embodiments, a path for signals is provided from one layer to another while using an ideal voltage reference for all areas of the package and still avoiding discontinuities in the voltage reference. In accordance with one illustrative embodiment, a reference plane adjustment engine analyzes a package design and identifies an ideal top plane for all areas of the package, including areas under particular chip(s) and areas that are not under a chip. The reference plane adjustment engine then modifies the package design to reposition ground planes, source voltage planes, signal planes, and vias between layers to maintain a continuous voltage reference regardless of the top layer such that the ideal top voltage plane for all areas is satisfied. The reference plane adjustment engine provides the resulting mixed voltage plane package design to a design analysis engine. A package fabrication system fabricates the package.

FIG. 5 illustrates an example cross-section of a chip package with a mixed top plane in accordance with an illustrative embodiment. The package includes chip 502 and chip 504, which are placed on package 500. Package 500 comprises a plurality of insulator layers 506 and a plurality of conductor layers 508. In the example depicted in FIG. 5, source voltage (VDD) plane 514 is the top voltage plane under chip 502 and ground plane 512 is the top plane in an area that is not under chip 502. This is referred to as a "mixed plane."

In the example depicted in FIG. 5, in area 530, signal plane 516 has a voltage reference by virtue of being positioned below source voltage plane 514 and above ground plane 532 under the area of chip 502. The voltage carried on signal plane 516 will be between GND and VDD; therefore, providing a voltage reference by placing signal plane 516 between voltage plane 514 and ground plane 532 results in a more stable signal.

Ground planes, source voltage planes, and signal planes, as well as vias between layers, are positioned to maintain a continuous voltage reference regardless of the top layer, and without adding a layer to the package. For example, vias 522 are used to connect the ground signal from layer 512 to layer 532. Via 524 is used to connect the source voltage plane down to layer 534. In an area that is not under chip 502, for example area 540, signal plane 516 has a voltage reference by virtue of being positioned below source voltage plane 534 and above ground plane 532.

Signal plane 516 is positioned in a conductive layer extending from beneath chip 502 to beneath chip 504. Signal plane 516 maintains a relatively consistent impedance from beneath chip 502 to beneath chip 504 by a balanced proximity of a conductive layer connected to the source voltage and a conductive layer connected to the ground potential, without adding layers to the laminate chip package.

The cross-sectional view shown in FIG. 5 illustrates an example of a mixed top plane design with continuous voltage reference. The example shown in FIG. 5 is not meant to imply any architectural limitations to a particular package design. That is, a mixed top plane design in accordance with the illustrative embodiments may vary with respect to which voltage plane is on top in various areas of the package, how the voltages and signal planes are connected between layers, which voltage reference is used in various areas of the package, and so forth. For instance, a package may include many chips on the same package. A chip will likely have many more signal paths and may require more connections to the ground plane and/or source voltage plane. Variations to the mixed top plane design with continuous voltage reference according to the illustrative embodiments will be readily apparent to those of ordinary skill in the art.

The mixed top plane design with continuous voltage reference according to the illustrative embodiments allows the initial fan-out of the chip signals to be referenced to their preferred voltage plane in densely populated C4 regions of the chip by minimizing the vias to lower layers, for example. The mixed top plane design with continuous voltage reference according to the illustrative embodiments also allows mixed voltage planes to be used at the top surface of the substrate or at another area where it is necessary to have mixed voltage planes for power distribution or signal referencing on the same plane. Furthermore, the mixed top plane design with continuous voltage reference according to the illustrative embodiments may be designed and manufactured while avoiding the need for additional layers to be added to the substrate, thus simplifying the manufacturing process and avoiding additional cost.

The package as described above may be part of the design for an integrated circuit chip. The package design may be created in a graphical computer programming language, and stored in a computer storage medium (such as a disk, tape, physical hard drive, or virtual hard drive such as in a storage access network). If the designer does not fabricate chip packages or the photolithographic masks used to fabricate chip packages, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the design in question that are to be formed on a substrate. The photolithographic masks are utilized to define areas of the substrate (and/or the layers thereon) to be etched or otherwise processed.

The resulting chip package can be distributed by the fabricator as a package alone, with no chip, or as a complete chip package, with chip(s) bonded to the package. In the latter case the chip is mounted in a chip package (such as a plastic carrier, with leads that are configured to be affixed to a motherboard or other higher level carrier) or in a multichip package (such as a ceramic carrier that has either or both surface interconnections or buried interconnections). In any case the complete chip package may then be integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor. Moreover, the end products in which the integrated circuit chips may be provided may include game machines, game consoles, hand-held computing devices, personal digital assistants, communication devices, such as wireless telephones and the like, laptop computing devices, desktop computing devices, server computing devices, or any other computing device.

Figure 6:
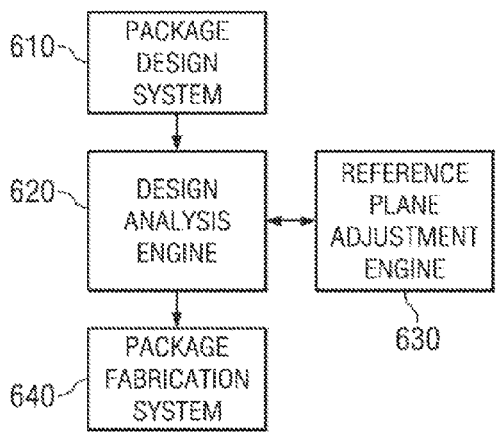
FIG. 6 is an exemplary block diagram of a system for generating a mixed top plane package in accordance with one exemplary embodiment.

FIG. 6 is an exemplary block diagram of a system for generating a mixed top plane package in accordance with one exemplary embodiment. As shown in FIG. 6, the system includes package design system 610, which is coupled to design analysis engine 620. Also coupled to design analysis engine 620 is reference plane adjustment engine 630 and package fabrication system 640. Package design system 610 provides a design for the package identifying the placement of signal lines, voltage and ground reference layers, voltage and ground vias, and the like. The package design data is provided to design analysis engine 620, which analyzes the design to identify, among other things, areas where voltage and signal planes, as well as vias between layers, may be repositioned to maintain a continuous voltage reference.

In one exemplary embodiment, the design analysis engine 620 may identify these areas through interaction with a user. The user may select areas that may be moved. Alternatively, the design analysis engine 620 may determine the transmission line characteristics of the signal layers with respect to the voltage reference provided by nearby source voltage and ground planes, using known circuit simulation technology, such as the Star-Hspice™ circuit simulator, for example. The design analysis engine 620 may then identify areas with substandard transmission line characteristics.

The identified areas where source voltage planes, ground planes, signal planes, and vias may be repositioned to maintain a continuous voltage reference are provided to reference plane adjustment engine 630 along with the package design data. Based on the identified areas to maintain a continuous voltage reference, reference plane adjustment engine 630 may reposition source voltage planes, ground planes, signal planes, and vias in the package design at the identified areas and adjusts voltage plane and signal plane layer depths.

In one exemplary embodiment, the reference plane adjustment engine 630 may reposition ground planes, source voltage planes, signal planes, and vias through interaction with a user. Alternatively, the reference plane adjustment engine 630 may use a trial-and-error approach to search through possible mixed-plane package designs to identify a mixed-plane package design that provides best transmission line characteristics for the signals being transmitted through the package. The resulting package design is provided to the package fabrication system 640 for fabrication of the mixed top plane package.

Figure 7:
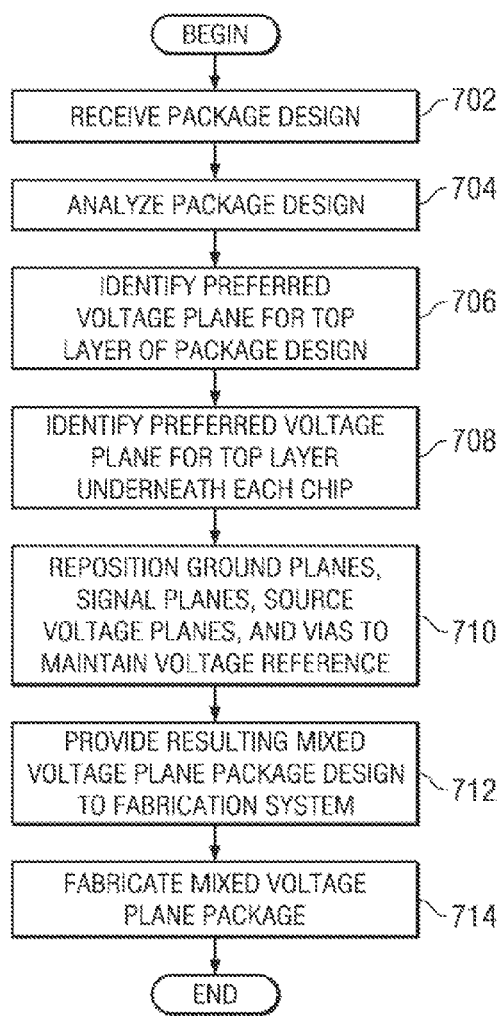
FIG. 7 is a flowchart illustrating operation of a design analysis engine with reference plane adjustment in accordance with an exemplary embodiment.

FIG. 7 is a flowchart illustrating operation of a design analysis engine with reference plane adjustment in accordance with an exemplary embodiment. It will be understood that each block of the flowchart illustration, and combinations of blocks in the flowchart illustration, can be implemented by computer program instructions. These computer program instructions may be provided to a processor or other programmable data processing apparatus to produce a machine, such that the instructions which execute on the processor or other programmable data processing apparatus create means for implementing the functions specified in the flowchart block or blocks. These computer program instructions may also be stored in a computer-readable memory or storage medium that can direct a processor or other programmable data processing apparatus to function in a particular manner, such that the instructions stored in the computer-readable memory or storage medium produce an article of manufacture including instruction means which implement the functions specified in the flowchart block or blocks.

Accordingly, blocks of the flowchart illustration support combinations of means for performing the specified functions, combinations of steps for performing the specified functions and program instruction means for performing the specified functions. It will also be understood that each block of the flowchart illustration, and combinations of blocks in the flowchart illustration, can be implemented by special purpose hardware-based computer systems which perform the specified functions or steps, or by combinations of special purpose hardware and computer instructions.

As shown in FIG. 7, operation begins and the design analysis engine receives the package design from the package design system (block 702). The design analysis engine analyzes the package design (block 704). The design analysis engine identifies a preferred voltage plane for the overall top layer of the package design (block 706). Then, the design analysis engine identifies a preferred voltage plane for the top layer underneath each chip (block 708). The design analysis engine may identify a preferred voltage plane for the top layer underneath each chip and for areas not under a chip by identifying a top layer that would result in the least amount of vias to lowers layers in a respective area of the top plane.

Next, the reference plane adjustment engine repositions the ground planes, the source voltage planes, the signal planes, and the vias to maintain a continuous voltage reference for the signal paths (block 710). In one exemplary embodiment, the reference plane adjustment engine may reposition ground planes, source voltage planes, signal planes, and vias through interaction with a user. Alternatively, the reference plane adjustment engine may use a trial-and-error approach to search through possible mixed-plane package designs to identify a mixed-plane package design that provides best transmission line characteristics for the signals being transmitted through the package.

The design analysis engine provides the resulting mixed voltage plane package design to the package fabrication system (block 712). The package fabrication system fabricates the mixed voltage plane package (block 714). Thereafter, operation ends.

Thus, the illustrative embodiments solve the disadvantages of the prior art by providing a smooth path for signals is provided from one layer to another while using the ideal voltage reference for all areas of the package and still avoiding discontinuities in the voltage reference. A reference plane adjustment engine analyzes a package design and identifies an ideal top plane for all areas of the package, including areas under particular chip(s) and areas that are not under a chip. The reference plane adjustment engine then modifies the package design to reposition ground planes, source voltage planes, signal planes, and vias between layers to maintain a continuous voltage reference regardless of the top layer. The reference plane adjustment engine provides the resulting mixed voltage plane package design to a design analysis engine. A package fabrication system fabricates the package.

It should be appreciated that the illustrative embodiments described above may take the form of an entirely hardware embodiment, an entirely software embodiment or an embodiment containing both hardware and software elements. In a preferred embodiment, the invention is implemented in software, which includes but is not limited to firmware, resident software, microcode, etc.

Furthermore, the illustrative embodiments may take the form of a computer program product accessible from a computer-usable or computer-readable medium providing program code for use by or in connection with a computer or any instruction execution system. For the purposes of this description, a computer-usable or computer readable medium may be any apparatus that may contain, store, communicate, propagate, or transport the program for use by or in connection with the instruction execution system, apparatus, or device.

The medium may be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

As described previously above, a data processing system suitable for storing and/or executing program code will include at least one processor coupled directly or indirectly to memory elements through a system bus. The memory elements may include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) may be coupled to the system either directly or through intervening I/O controllers. Network adapters may also be coupled to the system to enable the data processing system to become coupled to other data processing systems or remote printers or storage devices through intervening private or public networks. Modems, cable modem and Ethernet cards are just a few of the currently available types of network adapters.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A device for fabricating a laminate chip package, comprising:
a package design system that provides a laminate package design for a laminate chip package having a plurality of insulator layers and a plurality of patterned conductive layers comprising a first conductive layer, a fourth conductive layer, and two intermediate conductive layers;
a design analysis engine that determines transmission line characteristics of signal layers with respect to a voltage reference provided by a nearby source voltage plane and nearby ground potential plane, identifies areas with substandard transmission line characteristics, and identifies a first preferred voltage plane for the first conductive layer within a first area of the laminate package design and a second preferred voltage plane for the first conductive layer within a second area of the laminate package design, wherein the first preferred voltage plane is one of a source voltage plane or a ground plane and the second preferred voltage plane is the other of the source voltage plane and the ground plane;

a reference plane adjustment engine that positions signal planes, source voltage planes, and ground planes within the plurality of conductive layers such that a path of the signal plane maintains a relatively consistent impedance from beneath the first area to beneath the second area by a balanced proximity to a conductive layer connected to the source voltage and a conductive layer connected to ground potential, without adding layers to the laminate package design, to form a mixed voltage plane package design; and a package fabrication system that fabricates the laminate chip package based on the mixed voltage plane package design.

2. The device of claim 1, wherein the first area is under a first chip and wherein the first voltage plane is a source voltage plane.

3. The device of claim 2, wherein the second area is not under a chip and wherein the second preferred voltage plane is the ground plane.

4. The device of claim 3, wherein the design analysis engine identifies a third preferred voltage plane for the first conductive layer within a third area of the laminate package design under a second chip, wherein the third preferred voltage plane is the source voltage plane; and wherein the reference plane adjustment engine positions the signal planes, the source voltage planes, and the ground planes within the plurality of conductive layers such that a path of the signal plane maintains a relatively consistent impedance from beneath the second area to beneath the third area by a balanced proximity to a conductive layer connected to the source voltage and a conductive layer connected to the ground potential, without adding layers to the laminate package design.

5. The device of claim 1, wherein the reference plane adjustment engine connects a source voltage plane from the first layer in the first area to a second layer within the two intermediate conductive layers in the second area using one or more vias.

6. The device of claim 5, wherein the reference plane adjustment engine connects the signal plane from the second layer in the first area to a third layer within the two intermediate conductive layers in the second area using one or more vias.

7. The device of claim 5, wherein the reference plane adjustment engine connects a ground plane from the third layer in the first area to the fourth layer in the second area using one or more vias such that the signal plane maintains a balanced proximity to the source voltage plane and the ground plane.

8. A data processing system, comprising:
a processor; and
a memory coupled to the processor, wherein the memory comprises instructions which, when executed by the processor, cause the processor to perform operations for fabricating a laminate chip package, the operations comprising:

receiving, from a package design system, a laminate package design for a laminate chip package having a plurality of insulator layers and a plurality of patterned conductive layers comprising a first conductive layer, a fourth conductive layer, and two intermediate conductive layers;

determining transmission line characteristics of signal layers with respect to a voltage reference provided by a nearby source voltage plane and nearby ground potential plane;

identifying areas with substandard transmission line characteristics;

identifying a first preferred voltage plane for the first conductive layer within a first area of the laminate package design and a second preferred voltage plane for the first conductive layer within a second area of the laminate package design, wherein the first preferred voltage plane is one of a source voltage plane or a ground plane and the second preferred voltage plane is the other of the source voltage plane and the ground plane; and positioning signal planes, source voltage planes, and ground planes within the plurality of conductive layers such that a path of the signal plane maintains a relatively consistent impedance from beneath the first area to beneath the second area by a balanced proximity to a conductive layer connected to the source voltage and a conductive layer connected to ground potential, without adding layers to the laminate package design, to form a mixed voltage plane package design, such that a package fabrication system fabricates the laminate chip package based on the mixed voltage plane package design.

9. The data processing system of claim 8, wherein the first area is under a first chip and wherein the first voltage plane is a source voltage plane.

10. The data processing system of claim 9, wherein the second area is not under a chip and wherein the second preferred voltage plane is the ground plane.

11. The data processing system of claim 10, wherein the operations further comprise:

identifying a third preferred voltage plane for the first conductive layer within a third area of the laminate package design under a second chip, wherein the third preferred voltage plane is the source voltage plane; and positioning the signal planes, the source voltage planes, and the ground planes within the plurality of conductive layers such that a path of the signal plane maintains a relatively consistent impedance from beneath the second area to beneath the third area by a balanced proximity to a conductive layer connected to the source voltage and a conductive layer connected to the ground potential, without adding layers to the laminate package design.

12. The data processing system of claim 8, wherein the operations further comprise:

connecting a source voltage plane from the first layer in the first area to a second layer within the two intermediate conductive layers in the second area using one or more vias.

13. The data processing system of claim 12, wherein the operations further comprise:

connecting the signal plane from the second layer in the first area to a third layer within the two intermediate conductive layers in the second area using one or more vias.

14. The data processing system of claim 13, wherein operations further comprise:

connecting a ground plane from the third layer in the first area to the fourth layer in the second area using one or more vias such that the signal plane maintains a balanced proximity to the source voltage plane and the ground plane.

15. A computer program product comprising a computer readable non-transitory storage medium having a computer readable program stored therein, wherein the computer readable program, when executed on a computing device, causes the computing device to:
   receive, from a package design system, a laminate package design for a laminate chip package having a plurality of insulator layers and a plurality of patterned conductive layers comprising a first conductive layer, a fourth conductive layer, and two intermediate conductive layers;
   determine transmission line characteristics of signal layers with respect to a voltage reference provided by a nearby source voltage plane and nearby ground potential plane;
   identify areas with substandard transmission line characteristics;
   identify a first preferred voltage plane for the first conductive layer within a first area of the laminate package design and a second preferred voltage plane for the first conductive layer within a second area of the laminate package design, wherein the first preferred voltage plane is one of a source voltage plane or a ground plane and the second preferred voltage plane is the other of the source voltage plane and the ground plane;
   position signal planes, source voltage planes, and ground planes within the plurality of conductive layers such that a path of the signal plane maintains a relatively consistent impedance from beneath the first area to beneath the second area by a balanced proximity to a conductive layer connected to the source voltage and a conductive layer connected to ground potential, without adding layers to the laminate package design, to form a mixed voltage plane package design, such that a package fabrication system fabricates the laminate chip package based on the mixed voltage plane package design.

16. The computer program product of claim 15, wherein the first area is under a first chip and wherein the first voltage plane is a source voltage plane.

17. The computer program product of claim 16, wherein the second area is not under a chip and wherein the second preferred voltage plane is the ground plane.

18. The computer program product of claim 17, wherein instructions further cause the processor to:
   identify a third preferred voltage plane for the first conductive layer within a third area of the laminate package design under a second chip, wherein the third preferred voltage plane is the source voltage plane; and
   position the signal planes, the source voltage planes, and the ground planes within the plurality of conductive layers such that a path of the signal plane maintains a relatively consistent impedance from beneath the second area to beneath the third area by a balanced proximity to a conductive layer connected to the source voltage and a conductive layer connected to the ground potential, without adding layers to the laminate package design.

19. The computer program product of claim 15, wherein instructions further cause the processor to:
   connect a source voltage plane from the first layer in the first area to a second layer within the two intermediate conductive layers in the second area using one or more vias.

20. The computer program product of claim 19, wherein instructions further cause the processor to:
   connect the signal plane from the second layer in the first area to a third layer within the two intermediate conductive layers in the second area using one or more vias; and
   connect a ground plane from the third layer in the first area to the fourth layer in the second area using one or more vias such that the signal plane maintains a balanced proximity to the source voltage plane and the ground plane.

* * * * *